(12) United States Patent
Wang et al.

(10) Patent No.: US 10,366,659 B2
(45) Date of Patent: Jul. 30, 2019

(54) ARRAY SUBSTRATES FOR ENHANCING GATE DRIVER ON ARRAY (GOA) RELIABILITY

(71) Applicant: Shenzhen China Star Optoelectronics Technology Co., Ltd, Shenzhen, Guangdong (CN)

(72) Inventors: Tianhong Wang, Guangdong (CN); Ping-sheng Kuo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 413 days.

(21) Appl. No.: 15/328,476

(22) PCT Filed: Jan. 12, 2017

(86) PCT No.: PCT/CN2017/071000
§ 371 (c)(1),
(2) Date: Jan. 23, 2017

(87) PCT Pub. No.: WO2018/120296
PCT Pub. Date: Jul. 5, 2018

(65) Prior Publication Data
US 2018/0336830 A1 Nov. 22, 2018

(30) Foreign Application Priority Data
Dec. 29, 2016 (CN) .......................... 2016 1 1248670

(51) Int. Cl.
*G09G 3/34* (2006.01)
*G09G 3/36* (2006.01)
(Continued)

(52) U.S. Cl.
CPC ............. *G09G 3/34* (2013.01); *G02F 1/1362* (2013.01); *G02F 1/136286* (2013.01);
(Continued)

(58) Field of Classification Search
CPC .......... G09G 3/34; G09G 3/20; G09G 3/3677; G09G 2310/0267; G09G 2300/0408; H01L 33/00; G02F 1/136286; G02F 1/1362
See application file for complete search history.

(56) References Cited

U.S. PATENT DOCUMENTS

2011/0150169 A1   1/2011  Lin
2016/0358666 A1*  12/2016 Pang ................... G11C 19/287
(Continued)

FOREIGN PATENT DOCUMENTS

CN   102789770 A   11/2012
CN   106200163 A   12/2016
CN   106251817 A   12/2016

*Primary Examiner* — Daniel D Chang
(74) *Attorney, Agent, or Firm* — Andrew C. Cheng

(57) ABSTRACT

The present disclosure relates to an array substrate for enhancing gate driver on array (GOA) reliability. The array substrate includes dual and adjacent VSS traces in a rim. The VSS traces include a first VSS trace and a second VSS trace, and 2n number of regulation capacitors are configured between the CF_COM trace and the second VSS trace via metal material in different layers. Alternatively, a single third VSS trace is configured between the GOA circuit and the CF_COM in the active display area (AA), and 2n number of regulation capacitors are configured between the CF_COM trace and the third VSS trace via metal material in different layers. The array substrate may be adopted in the mass production of the TFT display panels.

13 Claims, 1 Drawing Sheet

(51) Int. Cl.
*H01L 33/00* (2010.01)
*G02F 1/1362* (2006.01)
*G09G 3/20* (2006.01)

(52) U.S. Cl.
CPC ............ *G09G 3/20* (2013.01); *G09G 3/3677* (2013.01); *H01L 33/00* (2013.01); *G09G 2300/0408* (2013.01); *G09G 2310/0267* (2013.01)

(56) References Cited

U.S. PATENT DOCUMENTS

2017/0256216 A1* 9/2017 Cao .......................... G09G 3/36
2019/0122626 A1* 4/2019 Du ........................ G02F 1/1362

* cited by examiner

ARRAY SUBSTRATES FOR ENHANCING GATE DRIVER ON ARRAY (GOA) RELIABILITY

BACKGROUND OF THE INVENTION

1. Field of the Invention

The present disclosure relates to display technology, and more particularly to an array substrate of enhancing gate driver on array (GOA) reliability.

2. Discussion of the Related Art

Liquid crystal devices (LCDs) are the most commonly used flat displays, wherein the thin film transistor (TFT) LCD is the most popular one. TFT-LCDs are characterized by attributes such as low cost, high yield rate, and good display performance, and are the main product in the LCD market. However, though the technology has been developed, the user demand toward higher display performance still drive more higher level development.

The conventional liquid crystal panel includes an array substrate, a color-filter substrate, and liquid crystal between the array substrate and the color-filter substrate. In the PCBA manufacturing process, a grounding capacitor is configured in the common end to regulate the voltage on the common end of the array substrate. The regulated voltage on the common end of the connects to the common electrode line within the liquid crystal panel via traces, including the traces on PCBA, the adhesive connection between the PCBA and the chip on film (COF), the COF traces, the adhesive connection between the COF and the liquid crystal panel, and the traces on the liquid crystal panel. The resistor (R) is between the common end on the PCBA and the internal common electrode line within the liquid crystal panel. With respect to the liquid crystal panel, as the data line, the gate line, and the common electrode line may couple, the voltage on the common end may be interfered, which is also referred to as noise. The voltage on the common end cannot quickly recover, the LCD display screen may be flutter or pan-green. At this moment, the voltage at the common end has to be regulated by a generation unit at the common end on the PCBA and the grounding capacitors in the rim of the generation unit. The resistor (R) greatly reduces the regulation ability provided by the generation unit and the grounding capacitors. Thus, it is necessary to propose an array substrate capable of preventing the VSS low voltage from being affected by other signals.

SUMMARY

The present disclosure relates to resolve the issue of low reliability of conventional GOA by proposing an array substrate for preventing the low voltage VSS signals being affected by other signals.

In one aspect, an array substrate for enhancing gate driver on array (GOA) reliability includes: a GOA circuit, a clock signals (CK) trace, a peripheral trace (CF_COM), an active display area (AA), wherein: the array substrate comprises dual and adjacent VSS traces in a rim, the VSS traces comprise a first VSS trace and a second VSS trace, 2n number of regulation capacitors are configured between the CF_COM trace and the second VSS trace via metal material in different layers, wherein n is a positive integer.

In another aspect, an array substrate for enhancing gate driver on array (GOA) reliability includes: a GOA circuit, a clock signals (CK) trace, a peripheral trace (CF_COM), an active display area (AA), wherein: a single third VSS trace is configured between the GOA circuit and the CF_COM in the active display area (AA), 2n number of regulation capacitors are configured between the CF_COM trace and the third VSS trace via metal material in different layers, wherein n is a positive integer.

Wherein an end of the first VSS trace connects with an end of the second VSS trace.

Wherein the CK trace comprises two CK traces arranged at two lateral sides of the active display area (AA), and the CK traces are respectively between the first VSS trace and the second VSS trace or arranged in a rim of the GOA circuit.

Wherein the third VSS trace is respectively arranged at two lateral sides of the active display area (AA).

Wherein 2n number of regulation capacitors are arranged at the two lateral sides of the active display area (AA) and are symmetrical to each other.

Wherein the GOA circuit is symmetrical with respect to two lateral sides of the active display area.

Wherein a regulation capacitor is configured in a connection location of the first VSS trace and the second VSS trace.

Wherein the array substrate is adopted in a display panel.

Wherein the first VSS trace, the second VSS trace, the third VSS trace, and the CF_COM trace are in different planes.

In view of the above, the regulation capacitors are configured within the VSS trace area to prevent the low voltage VSS from being affected by other signals. Thus, while the function of the GOA circuit 1 is prevented from being decayed by adopting the above design, the noise amplitude caused toward the output of the scanning driving signals and the low voltage VSS may be enhanced, which enhances the GOA reliability.

Thus, the array substrate in the present disclosure not only can enhances the GOA reliability, but also can enhance the color shift issue in the display area.

DETAILED DESCRIPTION OF THE EMBODIMENTS

Embodiments of the invention will now be described more fully hereinafter with reference to the accompanying drawings, in which embodiments of the invention are shown.

Figure 1:
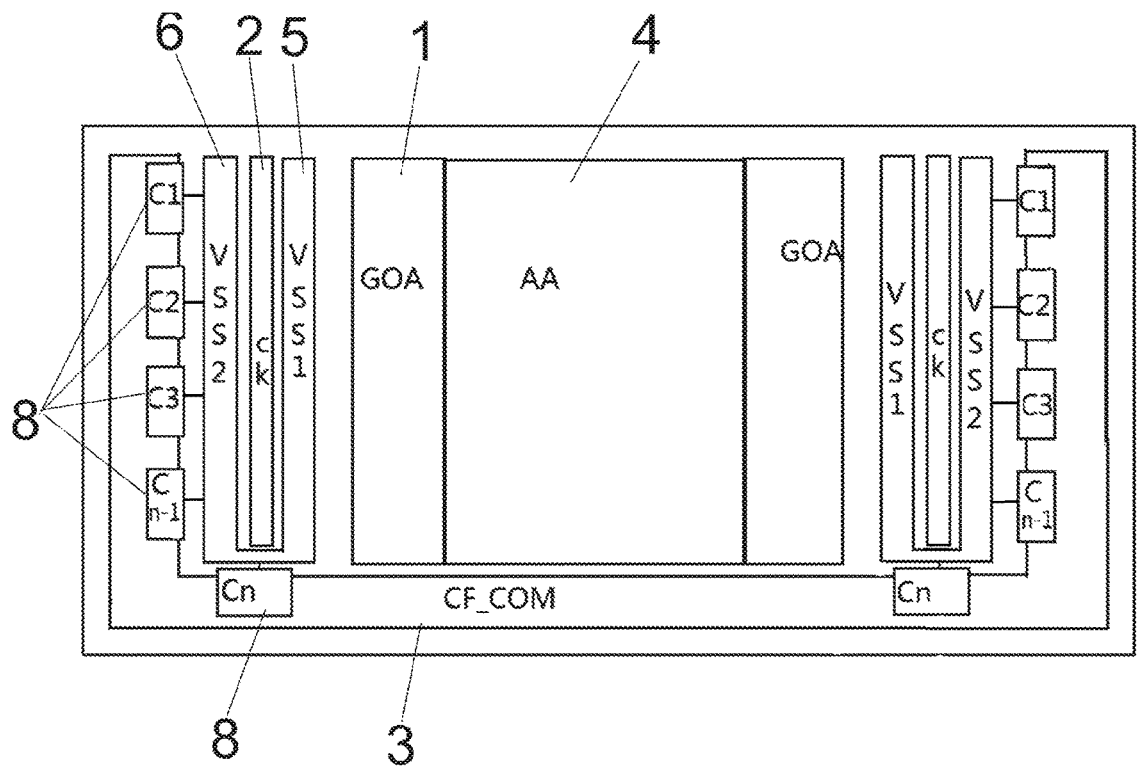
FIG. 1 is a schematic view of the dual VSS wirings in accordance with one embodiment.

FIG. 1 is a schematic view of the dual VSS wirings in accordance with one embodiment.

Figure 2:
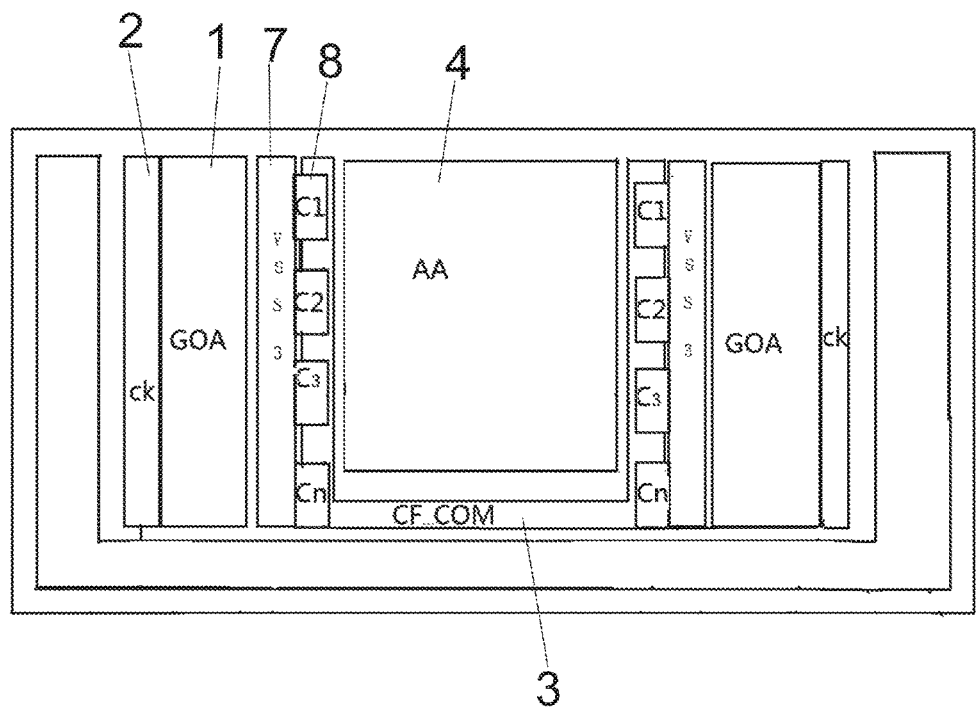
FIG. 2 is a schematic view of the single VSS wirings in accordance with one embodiment.

FIG. 2 is a schematic view of the single VSS wirings in accordance with one embodiment.

In the first embodiment:

An array substrate for enhancing GOA reliability includes a GOA circuit 1, a clock signals (CK) trace 2, a peripheral trace (CF_COM) 3, an active display area (AA) 4, wherein the CF_COM is a testing pad (Pad) lead out from the CF_COM Lead on the COF.

As shown in FIG. 1, the array substrate includes dual and adjacent VSS traces in a rim, wherein VSS is a common negative electrode, which also relates to a voltage serious. The VSS traces include a first VSS trace 5 (VSS1) and a second VSS trace 6 (VSS2), 2n number of regulation capacitors 8 are configured between the CF_COM trace 3 and the second VSS trace 6 (VSS2) via the metal material in different layers, wherein n is a positive integer. An end of the first VS S trace 5 (VSS1) connects with an end of the second VSS trace 6 (VSS2), and a regulation capacitor is configured in a connection location of the first VSS trace 5 (VSS1) and the second VSS trace 6 (VSS2).

The CK trace 2 includes two CK traces 2 arranged at two lateral sides of the active display area (AA) 4. That is, the CK traces 2 are respectively between the first VSS trace 5 (VSS1) and the second VS S trace 6 (VSS2) or arranged in a rim of the GOA circuit 1. The 2n number of regulation capacitors are arranged at the left side and the right side of the active display area (AA) 4 and are symmetrical to each other. One plate layer of the regulation capacitors 8 is made by metallic material different from the VSS trace. The GOA circuit 1 is symmetrical with respect to two lateral sides of the active display area (AA) 4. The array substrate for enhancing the GOA reliability may be adopted in the display panel. The first VSS trace 5 (VSS1), the second VSS trace 6 (VSS2), a third VSS trace 7 (VSS3), and the CF_COM trace 3 are in different planes.

Second Embodiment

The impact caused by the VSS trace will be described hereinafter.

The array substrate for enhancing the GOA reliability includes the GOA circuit 1, the CK trace 2, the CF_COM trace 3, and the active display area 4 (AA).

As shown in FIG. 2, a single third VSS trace 7 (VSS3) is configured between the GOA circuit 1 and the CF_COM trace 3 of the active display area 4 (AA), wherein 2n number of regulation capacitors 8 are configured between the third VSS trace 7 (VSS3) and the CF_COM trace 3 by metallic materials in different layer, wherein n is a positive integer. The third VSS trace 7 (VSS3) is arranged at both sides of the active display area 4 (AA).

The CK trace 2 includes two CK traces 2 arranged at two lateral sides of the active display area (AA) 4. That is, the CK traces 2 are respectively between the first VSS trace 5 (VSS1) and the second VS S trace 6 (VSS2) or arranged in a rim of the GOA circuit 1. The 2n number of regulation capacitors are arranged at the left side and the right side of the active display area (AA) 4 and are symmetrical to each other. One plate layer of the regulation capacitors 8 is made by metallic material different from the VSS trace. The GOA circuit 1 is symmetrical on both sides of the active display area (AA) 4. The array substrate for enhancing the GOA reliability may be adopted in the display panel. The first VSS trace 5 (VSS1), the second VSS trace 6 (VSS2), the third VSS trace 7 (VSS3), and the CF_COM trace 3 are in different planes.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An array substrate for enhancing gate driver on array (GOA) reliability, comprising:
   a GOA circuit, a clock signals (CK) trace, a peripheral trace (CF_COM), an active display area (AA), wherein:
   the array substrate comprises dual and adjacent VSS traces in a rim, the VSS traces comprise a first VSS trace and a second VSS trace, 2n number of regulation capacitors are configured between the CF_COM trace and the second VSS trace via metal material in different layers, wherein n is a positive integer.

2. The array substrate as claimed in claim 1, wherein an end of the first VSS trace connects with an end of the second VSS trace.

3. The array substrate as claimed in claim 2, wherein the CK trace comprises two CK traces arranged at two lateral sides of the active display area (AA), and the CK traces are respectively between the first VSS trace and the second VSS trace or arranged in a rim of the GOA circuit.

4. The array substrate as claimed in claim 1, wherein 2n number of regulation capacitors are arranged at the two lateral sides of the active display area (AA) and are symmetrical to each other.

5. The array substrate as claimed in claim 1, wherein the GOA circuit is symmetrical with respect to two lateral sides of the active display area.

6. The array substrate as claimed in claim 1, wherein a regulation capacitor is configured in a connection location of the first VSS trace and the second VSS trace.

7. The array substrate as claimed in claim 1, wherein the array substrate is adopted in a display panel.

8. The array substrate as claimed in claim 1, wherein the first VSS trace, the second VSS trace, and the CF_COM trace are in different planes.

9. An array substrate for enhancing gate driver on array (GOA) reliability, comprising:
   a GOA circuit, a clock signals (CK) trace, a peripheral trace (CF_COM), an active display area (AA), wherein:
   a single third VSS trace is configured between the GOA circuit and the CF_COM in the active display area (AA), 2n number of regulation capacitors are configured between the CF_COM trace and the third VSS trace via metal material in different layers, wherein n is a positive integer.

10. The array substrate as claimed in claim 9, wherein the third VSS trace is respectively arranged at two lateral sides of the active display area (AA).

11. The array substrate as claimed in claim 9, wherein 2n number of regulation capacitors are arranged at the two lateral sides of the active display area (AA) and are symmetrical to each other.

12. The array substrate as claimed in claim 9, wherein the GOA circuit is symmetrical with respect to two lateral sides of the active display area.

13. The array substrate as claimed in claim 9, wherein the first VSS trace, the second VSS trace, the third VSS trace, and the CF_COM trace are in different planes.

\* \* \* \* \*